United States Patent
Leong et al.

(10) Patent No.: US 11,671,068 B1
(45) Date of Patent: Jun. 6, 2023

(54) INTEGRATED LC TANK WITH THIRD ORDER HARMONIC TRAP

(71) Applicant: Realtek Semiconductor Corp., Hsinchu (TW)

(72) Inventors: Poh-boon Leong, Pleasanton, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/678,177

(22) Filed: Feb. 23, 2022

(51) Int. Cl.
*H03H 7/01* (2006.01)
*H03H 1/00* (2006.01)

(52) U.S. Cl.
CPC ........ *H03H 7/0115* (2013.01); *H03H 7/1741* (2013.01); *H03H 2001/0085* (2013.01); *H03H 2007/013* (2013.01)

(58) Field of Classification Search
CPC .......... H03H 7/0115; H03H 2007/013; H03H 7/1741
USPC .................................................. 333/175, 176
See application file for complete search history.

(56) References Cited

U.S. PATENT DOCUMENTS

2020/0266792 A1\* 8/2020 Bagga .................. H03H 7/0115

\* cited by examiner

*Primary Examiner* — Rakesh B Patel
(74) *Attorney, Agent, or Firm* — McClure, Qualey & Rodack, LLP

(57) ABSTRACT

An LC (inductor-capacitor) tank includes a primary 8-shape inductor and a serial LC network that are connected in parallel across a first node and a second node and laid out using a multi-layer structure fabricated on a substrate, wherein a magnetic coupling between the primary 8-shape inductor and the serial LC network is mitigated due to a layout symmetry, and a resonant frequency of the serial LC network is equal to three times of a resonance frequency of the LC tank.

15 Claims, 4 Drawing Sheets

US 11,671,068 B1

INTEGRATED LC TANK WITH THIRD ORDER HARMONIC TRAP

BACKGROUND OF THE DISCLOSURE

Field of the Disclosure

This present disclosure generally relates to an integrated LC tank, and particularly to an integrated LC tank with a third order harmonic trap.

Description of Related Art

A conventional LC (which stands for inductor-capacitor) tank comprises a parallel connection of an inductor and a capacitor and is configured to provide a high impedance at a resonant frequency. In a particular case of interest, where an LC tank is fabricated on a single substrate, it is said to be an integrated LC tank, and a cost of the integrated LC tank is determined by a layout area. An integrated LC tank is usually used as a load of a current signal of a fundamental frequency generated by a gain device and configured to convert the current signal into a voltage signal with a high gain. As is known, the fundamental frequency is approximately equal to the resonant frequency.

In certain configurations, the gain device is an amplifier. In other configurations, the gain device is a mixer. A nonlinearity of the gain device usually results in an appreciable $3^{rd}$ order harmonic component within the current signal. The $3^{rd}$ order harmonic component is often detrimental and may further result in other undesired spurious frequency components through various mixing mechanisms in a subsequent circuit. A $3^{rd}$ harmonic filter can be used to suppress the third order harmonic component but may cause a few issues. First, the $3^{rd}$ order harmonic filter may introduce an appreciable insertion loss to the current signal. Second, the $3^{rd}$ harmonic filter may occupy an appreciable layout area and greatly increase the cost of the integrated LC tank. Third, there might be a strong interaction between the $3^{rd}$ order harmonic filter and the integrated LC tank and adversely impact the response of the integrated LC tank at the fundamental frequency.

What is desired is an integrated LC filter that can effectively suppress the $3^{rd}$ order harmonic component yet does not demand a large layout area, does not introduce an appreciable insertion loss, nor adversely impacts the response at the fundamental frequency.

SUMMARY OF THE DISCLOSURE

In an embodiment, an LC (inductor-capacitor) tank comprises: a primary 8-shape inductor and a serial LC network that are connected in parallel across a first node and a second node and laid out using a multi-layer structure fabricated on a substrate, wherein a magnetic coupling between the primary 8-shape inductor and the serial LC network is mitigated due to a layout symmetry, and a resonant frequency of the serial LC network is equal to three times of a resonance frequency of the LC tank.

In an embodiment, an LC (inductor-capacitor) tank comprises: a primary 8-shape inductor and a serial LC network that are connected in parallel across a first node and a second node and laid out using a multi-layer structure fabricated on a substrate, wherein: the primary 8-shape inductor comprises a serial connection of a first quadrant inductor, a second quadrant inductor, a third quadrant inductor, and a fourth quadrant inductor; the serial LC network comprises a serial connection of a first half inductor, a serial capacitor, and a second half inductor; the third quadrant inductor is substantially a mirror image of the first quadrant inductor with respect to a plane of symmetry; the second quadrant inductor is substantially a mirror image of the fourth quadrant inductor with respect to the plane of symmetry; the first half inductor is substantially symmetrical with respect to the plane of symmetry; and the second half inductor is substantially symmetrical with respect to the plane of symmetry.

DETAILED DESCRIPTION OF THIS DISCLOSURE

Figure 1A:
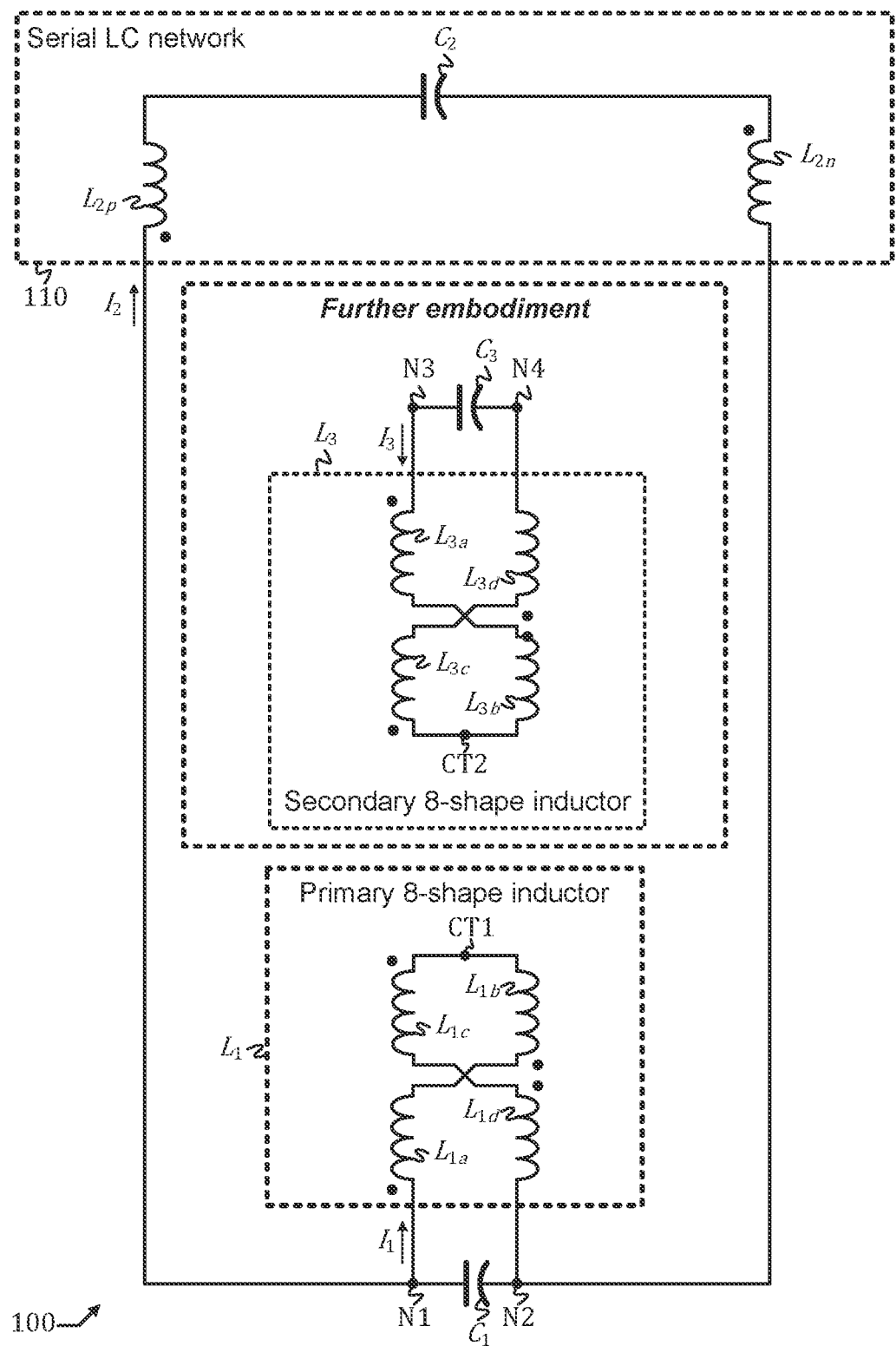
FIG. 1A shows a schematic diagram of an LC tank in accordance with an embodiment of the present disclosure.

The present disclosure is directed to LC tank. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "frequency," "amplifier," "mixer," "load," "impedance," "resonance," "serial connection," "parallel connection "switch," "inductor," "capacitor" "circuit node," "ground," "DC (direct current)," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skill in the art understand how to calculate an impedance for inductor and capacitor, and understand Ohm's Law and a relation among voltage, current, and impedance.

Those of ordinary skill in the art can read schematics of a circuit comprising electronic components such as inductors, capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A circuit is a collection of a transistor, a capacitor, a resistor, and/or other electronic devices inter-connected in a certain manner to embody a certain function.

In this disclosure, a "circuit node" is frequently simply stated as a "node" for short, when what it means is clear from a context.

A signal is a voltage or a current of a variable level that carries a certain information and can vary with time. A level of the signal at a moment represents a state of the signal at that moment.

A network is a circuit or a collection of circuits.

A power supply node is a circuit node of a substantially stationary voltage, and so is a ground node. Power supply node and ground node are both DC (direct current) nodes but differ in voltage level; that is, a voltage level of a power supply node is higher than a voltage level of a ground node. Following a convention widely used in the literature, in this disclosure, in a circuit, "$V_{DD}$" denotes a power supply node. Although a DC level of a ground node is usually OV, it doesn't have to be OV. What matters is a voltage difference between the power supply node and the ground node. For a given circuit, a behavior of that circuit remains the same if a DC voltage level is raised by the same amount for all nodes.

A logical signal is a voltage signal of two states: a low state and a high state; the logical signal is in the high state when its voltage level is above a trip point and in the low state otherwise. The low state is also referred to as a "0" state, while the high stage is also referred to as a "1" state. Regarding a logical signal Q, "Q is high" or "Q is low," means that "Q is in the high state" or "Q is in the low state." Likewise, "Q is 1" or "Q is 0," means that "Q is in the 1 state" or "Q is in the 0 state."

A first logical signal may not necessarily have the same trip point as a second logical signal.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A logical signal is often used as a control signal to enable or disable a function of a circuit. When the logical signal is in a logical state that enables the function of the circuit, the logical signal is said to be "asserted"; otherwise, the logical signal is said to be "de-asserted." When a logical signal is "asserted" when it is high, it is said to be "active high"; when a logical signal is "asserted" when it is low, it is said to be "active low."

Switches appear in the present disclosure. A switch is a device configured to conditionally connect a first node to a second node in accordance with a control by a logical signal; said switch is turned on and behaves like a short circuit when said logical signal is asserted; and said switch is turned off and behaves like an open circuit when said logical control signal is de-asserted.

An NMOS transistor can function as an amplifier when it is biased in a saturation region where a gate-to-source voltage is higher than a threshold voltage, but a gate-to-drain voltage is lower than the threshold voltage.

An NMOS transistor can function as a switch controlled by a control signal if it is in a triode region when the control signal is asserted (wherein both a gate-to-source voltage and a gate-to-drain voltage are higher than a threshold voltage) and is in a cut-off region when the control signal is de-asserted (wherein both the gate-to-source voltage and the gate-to-drain voltage are lower than the threshold voltage).

A first objective of the present disclosure is to have an LC tank that can have an impedance that is very high at a fundamental frequency but very low at a $3^{rd}$ harmonic frequency.

A second objective is that there is very little, if any, conflict between having a very low impedance at the $3^{rd}$ harmonic frequency and having a very high impedance at the fundamental frequency. In other words, reducing (i.e., improving) the impedance at the $3^{rd}$ harmonic frequency does not compromise with reducing (i.e., degrading) the impedance at the fundamental frequency.

A third objective is that the LC tank can be layout efficient and does not need to occupy a large layout area.

A schematic diagram of an LC tank 100 in accordance with an embodiment of the present disclosure is shown in FIG. 1A. LC tank 100 comprises: a primary 8-shape inductor $L_1$, a primary capacitor $C_1$, and a serial LC network 110 that are connected in parallel across a first node N1 and a second node N2, wherein the primary 8-shape inductor $L_1$ comprises a serial connection of four inductors including a lower-left inductor $L_{1a}$ (which is referred to as a first quadrant inductor), a upper-right inductor $L_{1b}$ (which is referred to as a second quadrant inductor), an upper-left inductor $L_{1c}$ (which is referred to as a third quadrant inductor), and a lower-right inductor $L_{1d}$ (which is referred to as fourth quadrant inductor), and the serial LC network 110 comprises a serial connection of a left inductor $L_{2p}$ (which is referred to as a first half inductor), a serial capacitor $C_2$, and a right inductor $L_{2n}$ (which is referred to as a second half inductor). The upper-right inductor $L_{1b}$ is connected to the upper-left inductor $L_{1c}$, at a primary center tap CT1. The lower-left inductor $L_{1a}$ is laid out to be substantially a mirror image of the upper-left inductor $L_{1c}$ with respect to a plane of symmetry. The upper-right inductor $L_{1b}$ is laid out to be substantially a mirror image of the lower-right inductor $L_{1d}$ with respect to the plane of symmetry.

Both the left inductor $L_{2p}$ and the right inductor $L_{2n}$ are laid out to be substantially symmetrical with respect to the plane of symmetry. When a first current $I_1$ flows from N1 to N2 through the primary 8-shape inductor $L_1$, each of Lia, $L_{1b}$, $L_{1c}$, and $L_{1d}$ excites a magnetic field that couples to both the left inductor $L_{2p}$ and the right inductor $L_{2n}$ and induces a second current $I_2$. Due to the substantial layout symmetry, a magnetic coupling from $L_{1a}$ to $L_{2p}$ ($L_{2n}$) is substantially canceled by a magnetic coupling from $L_{1a}$, to $L_{2p}$ ($L_{2n}$), and likewise a magnetic coupling from $L_{1b}$ to $L_{2p}$ ($L_{2n}$) is substantially canceled by a magnetic coupling from $L_{1d}$ to $L_{2p}$ ($L_{2n}$). Therefore, a net magnetic coupling between the primary 8-shape inductor $L_1$ and the serial LC network 110 can be effectively mitigated; that is, the second current $I_2$ flowing through the serial LC network 110 due to an induction of the magnetic field excited by the primary 8-shape inductor $L_1$ can be very small.

In an embodiment, the LC tank 100 is configured to provide an impedance (as measured across N1 and N2), denoted by $Z_{100}$, that is high at a fundamental frequency $f_0$ but low at a third harmonic frequency $3f_0$. In the absence of an appreciable magnetic coupling from the primary 8-shape inductor $L_1$ to $L_{2p}$ and $L_{2n}$ and in a first order approximation wherein both $C_1$ and $L_1$ have a very high quality factor, $Z_{100}$ can be expressed by the following equation:

$$Z_{100} \approx \frac{1}{j2\pi f C_1 - \frac{j}{2\pi f L_1} + \frac{1}{Z_{110}}} \quad (1)$$

Here, f denotes a frequency variable, and $Z_{110}$ denotes an impedance of the serial LC network 110 that can be expressed by the following equation:

$$Z_{110} = j2\pi f(L_{2p}+L_{2n}) - j/(2\pi C_2) \quad (2)$$

It is clear that $Z_{110}$ is approximately zero at the third harmonic frequency $3f_0$ if the following condition holds:

$$6\pi f_0(L_{2p}+L_{2n}) = 1/(6\pi f_0 C_2) \quad (3)$$

Or equivalently, $$L_{2p} + L_{2n} = \frac{1}{(6\pi f_0)^2 C_2} \quad (4)$$

When the condition of equation (4) holds, the serial LC network 110 forms a serial resonance at the $3^{rd}$ harmonic frequency, wherein an impedance of a combination of $L_{2p}$ and $L_{2n}$ is equal to an impedance of $C_2$ in magnitude but opposite in polarity; consequently, $Z_{110}$ is nearly zero at the third harmonic frequency $3f_0$, and so is $Z_{100}$. In this case, a $3^{rd}$ harmonic frequency component will be effectively "trapped" by the serial LC network 110.

From equations (2) and (4), one can find that the value of $Z_{110}$ at the fundamental frequency $f_0$ is $$Z_{110}(f_0) = \frac{-j}{2\pi f_0 \left(\frac{9}{8}C_2\right)} \quad (5)$$

So, at the fundamental frequency $f_0$, the serial LC network 110 behaves like an equivalent capacitor $C_2'$ of a capacitance equal to $9C_2/8$, and the value of $Z_{100}$ at the fundamental frequency can be written as:

$$Z_{100}(f_0) \approx \frac{1}{j2\pi f_0(C_1+C_2') - \frac{j}{2\pi f_0 L_1}} \quad (6)$$

where $C_2' \equiv 9C_2/8$.

Therefore, $Z_{100}$ is very large at the fundamental frequency $f_0$ if the following condition holds:

$$2\pi f_0(C_1+C_2') = 1/(2\pi f_0 L_1) \quad (7)$$

Or equivalently, $$L_1 = \frac{1}{(2\pi f_0)^2(C_1+C_2')} \quad (8)$$

The first objective that $Z_{100}$ can be very high at $f_0$ but very low at $3f_0$ is thus fulfilled.

The second objective that there is very little, if any, conflict between having a very low impedance at the $3^{rd}$ harmonic frequency and having a very high impedance at the fundamental frequency is also fulfilled. This is because, that $Z_{100}$ can be very low at $3f_0$ relies on satisfying the condition of equation (4), while that $Z_{100}$ can be very high at $f_0$ relies on satisfying the condition of equation (8), and the two conditions are independent and thus can both be satisfied at the same time. How low $Z_{100}$ can be at $3f_0$ is mostly limited by a qualify factor of $L_{2p}$ and $L_{2n}$, and how high $Z_{100}$ can be at $f_0$ is mostly limited by a qualify factor of $L_1$, and there is no conflict between the two.

From equation (8), a significant aspect is $(C_1+C_2')$, a sum of capacitance of the primary capacitor $C_1$ and the equivalent capacitor $C_2'$. Therefore, one can choose to deliberately eliminate $C_1$ (i.e., choosing $C_1=0$, which corresponds to an open circuit) and totally rely on choosing a proper combination of values of $C_2$ (and consequently $C_2'$), $L_{2p}$, $L_{2n}$, and $L_1$ in accordance with equations (4) and (8) to achieve a very high impedance at the fundamental frequency $f_o$ and a very low impedance at the third harmonic frequency $3f_0$.

Figure 1B:
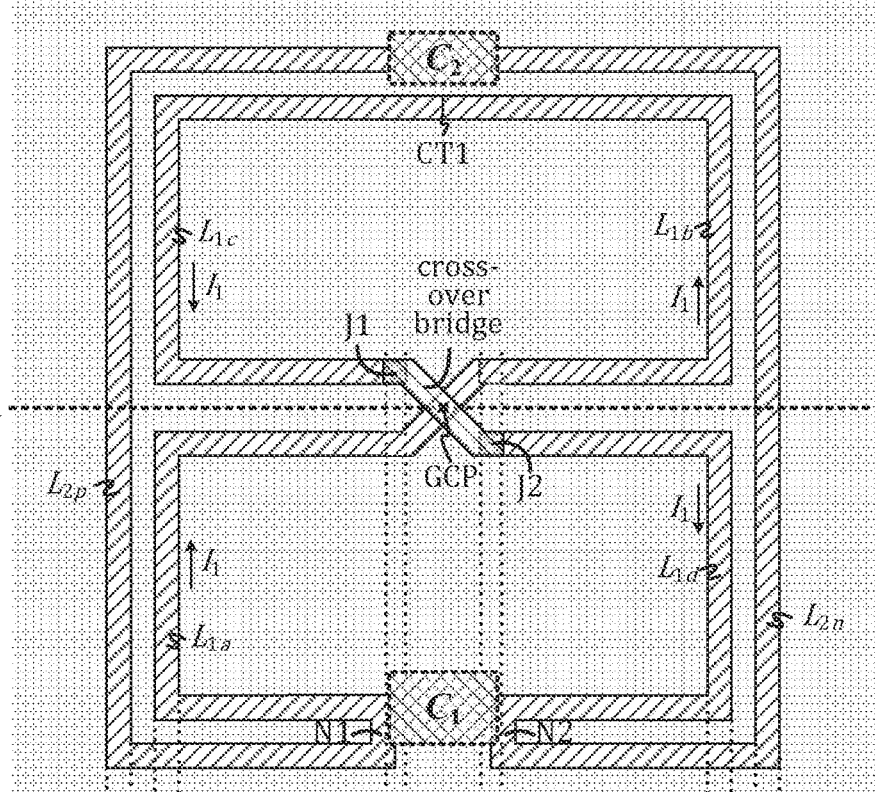
FIG. 1B shows a layout of the LC tank of FIG. 1A in accordance with an embodiment of the present disclosure.

In an embodiment, LC tank 100 is fabricated using a multi-layer structure laid out on a substrate. The multi-layer structure comprises a plurality of metal layers, including a first metal layer denoted by "M1," a second metal layer denoted by "M2," and a set of lower metal layers that can be used to efficiently lay out an inter-digitating multi-finger MOM (metal-oxide-metal) capacitor, and a plurality of inter-connection via layers including a via layer denoted by "V12" that provides inter-connection between "M1" and "M2." An exemplary layout of LC tank 100 in accordance with an embodiment of the present disclosure is shown in FIG. 1B. Here, a legend, a top view, and a side view are shown.

From the top view, the primary 8-shape inductor $L_1$ is embodied by a serial connection of $L_{1a}$, $L_{1b}$, $L_{1c}$, and $L_{1d}$; $L_{1a}$ is laid out on M1 from N1 to a geometrical central point GCP; $L_{1b}$ is laid out on M1 from the geometrical central point GCP to the primary center tap CT1; $L_{1c}$ is laid out from the primary center tap CT1 to the geometrical central point GCP mostly on M1 but with a small section on M2 that constitutes an upper half of a cross-over bridge centered at the geometrical central point GCP, along with a first via J1 on V12; $L_{1d}$ is laid out from the geometrical central point GCP to N2 mostly on M1 but with a small section on M2 that constitutes a lower half of the cross-over bridge centered at the geometrical central point GCP, along with a second via J2 on V12.

In addition, $C_1$ is a MOM capacitor laid out across N1 and N2. $C_2$ is also a MOM capacitor, connects to $L_{2p}$ on one side and to $L_{2n}$ on the other side. Clearly, $L_1$ is substantially a mirror image of $L_{1a}$ with respect to the plane of symmetry, and $L_{1b}$ is substantially a mirror image of $L_{1d}$ with respect to the plane of symmetry. Both $L_{2p}$ and $L_{2n}$ are laid out on M1 substantially symmetrical with respect to the plane of symmetry. A lower half of $L_{2p}$ is adjacent to and parallel with a major part of Lia, while an upper half of $L_{2p}$ is adjacent to and parallel with a major part of $L_{1c}$. A lower half of $L_{2n}$ is adjacent to and parallel with a major part of $L_{1d}$, while an upper half of $L_{2n}$ is adjacent to and parallel with a major part of $L_{1b}$. When the first current $I_1$ flows through $L_1$ from N1 to N2, it flows through $L_{1a}$ in a clockwise direction, then through $L_{1b}$ in a counterclockwise direction, then through $L_{1c}$ in a counterclockwise direction, and finally through $L_{1d}$ in a clockwise direction, and in the meanwhile excites a magnetic field that couples to both $L_{2p}$ and $L_{2n}$. Due to the symmetry, however, a magnetic coupling from Lia to both $L_{2p}$ and $L_{2n}$ is substantially equal to a magnetic coupling from $L_{1c}$ to both $L_{2p}$ and $L_{2n}$ in magnitude but opposite in polarity and thus is substantially canceled. Likewise, a magnetic coupling from $L_{1b}$ to both $L_{2p}$ and $L_{2n}$ is substantially equal to a magnetic coupling from $L_{1d}$ to both $L_{2p}$ and $L_{2n}$ in magnitude but opposite in polarity and thus is substantially canceled. As a result, a net magnetic coupling from the primary 8-shape inductor $L_1$ to both $L_{2p}$ and $L_{2n}$ is very small. By using the reciprocity theorem, a net magnetic coupling from both $L_{2p}$ and $L_{2n}$ to the primary 8-shape inductor $L_1$ is also very small.

Since $L_{2p}$ and $L_{2n}$ are laid out to be enclosing the primary 8-shape inductor $L_1$, a layout area occupied by the primary 8-shape inductor $L_1$ is re-used by $L_{2p}$ and $L_{2n}$. Therefore, the third objective that the LC tank can be layout efficient is fulfilled.

In an alternative embodiment (not shown in figure but clear to those of ordinary skill in the art), $L_{2p}$ and $L_{2n}$ are laid out on "M2," instead of on "M1." In this alternative embodiment, the symmetry also holds, and therefore, the consequence that the net magnetic coupling between the 8-shape inductor $L_1$ and both $L_{2p}$ and $L_{2n}$ is very small also holds.

Now refer to FIG. 1A. In an alternative embodiment not shown in figure but clear to those of ordinary skill in the art: $C_2$ is removed (i.e., becomes a short circuit) and replaced by two capacitors of double capacitance, one inserted between $L_{2p}$ and N1 and the other inserted between $L_{2n}$ and N2. This way, $Z_{110}$ remains the same.

In a further embodiment, LC tank 100 further comprises a secondary 8-shape inductor $L_3$ and a secondary capacitor $C_3$ that are connected in parallel across a third node N3 and a fourth node N4, wherein the secondary 8-shape inductor $L_3$ comprises a serial connection of four inductors including inductor $L_{3a}$, inductor $L_{3b}$, inductor $L_{3c}$, and inductor $L_{3d}$. Inductor $L_{3b}$ is connected to inductor $L_{3c}$ at a secondary center tap CT2. Inductor $L_{3a}$ is laid out to be substantially a mirror image of inductor $L_{3c}$ with respect to the plane of symmetry. Inductor $L_{3b}$ is laid out to be substantially a mirror image of inductor $L_{3d}$ with respect to the plane of symmetry. When a third current $I_3$ flows from N3 to N4 through the second 8-shape inductor $L_3$, each of $L_{3a}$, $L_{3b}$, $L_{3c}$, and $L_{3d}$ excites a magnetic field that couples to both the left inductor $L_{2p}$ and the right inductor $L_{2n}$. Due to the substantial layout symmetry, a magnetic coupling from $L_{3a}$ to $L_{2p}$ ($L_{2n}$) is substantially canceled by a magnetic coupling from $L_{3c}$ to $L_{2p}$ ($L_{2n}$), and likewise a magnetic coupling from $L_{3b}$ to $L_{2p}$ ($L_{2n}$) is substantially canceled by a magnetic coupling from $L_{3d}$ to $L_{2p}$ ($L_{2n}$). Therefore, a net magnetic coupling between the secondary 8-shape inductor $L_3$ and the serial LC network 110 can be effectively mitigated.

On the other hand, the secondary 8-shape inductor $L_3$ is laid out to have a strong mutual coupling with the primary 8-shape inductor $L_1$, so that the first current $I_1$ on the primary 8-shape inductor $L_1$ can be effectively coupled to the third current $I_3$ on the secondary 8-shape inductor $L_3$. This can be done by adopting a transformer layout style, for instance, by laying out $L_3$ to be substantially over-lapped with $L_1$ as seen from the top view but separated from $L_1$ as seen from the side view by using metal layers other than M1 and M2. This way, $L_3$ has the same symmetry as $L_1$, and the coupling between $L_3$ and $L_1$ can be strong due to the over-lapping. Those skilled in the art can adopt whatever layout style provided the symmetry holds, so that a net magnetic coupling from $L_1$ (and $L_3$ if applicable) to $L_{2p}$ and $L_{2n}$ is effectively mitigated.

Figure 2:
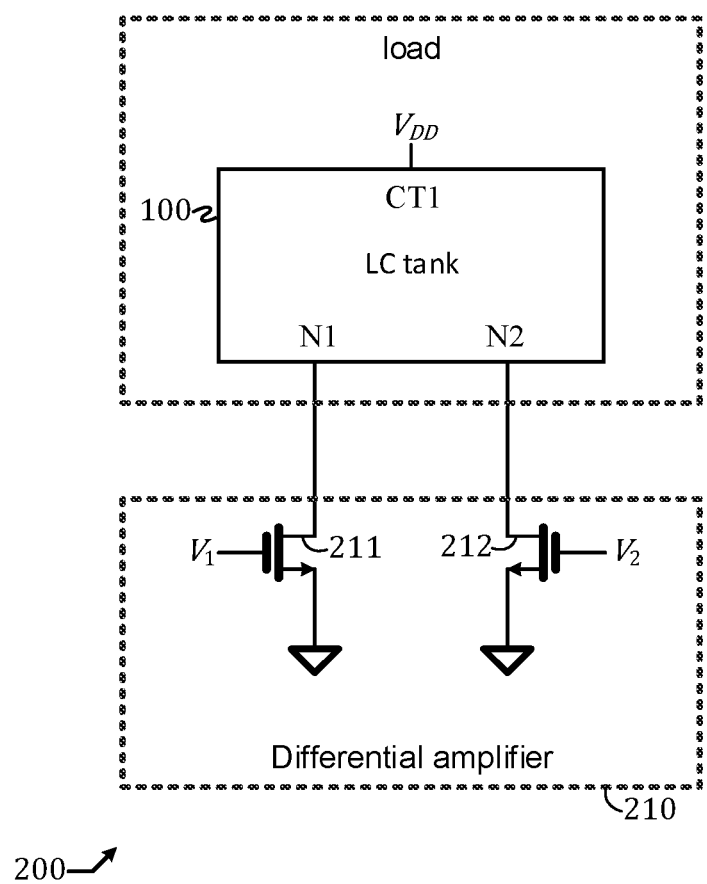
FIG. 2 shows a schematic diagram of an application circuit of the LC tank of FIG. 1A.

As shown in FIG. 2, an application circuit 200 in accordance with an embodiment of the present disclosure comprises: a differential amplifier 210 comprising two NMOS transistors 211 and 212 configured to receive a differential signal and establish an output using LC tank 100 as a load. The differential amplifier 210 comprises two NMOS transistors 211 and 212, while the differential signal comprises two voltage signals $V_1$ and $V_2$. A source, a gate, and a drain of NMOS transistor 211 connect to ground, the voltage signal $V_1$, and the first node N1 of LC tank 100, respectively. A source, a gate, and a drain of NMOS transistor 212 connect to ground, the voltage signal $V_2$, and the second node N2 of LC tank 100, respectively. The primary center tap CT1 of LC tank 100 connects to a power supply node $V_{DD}$. An output of the application circuit 200 is a voltage difference between N1 and N2. If LC tank 100 further comprises the secondary 8-shape inductor $L_3$ (shown in FIG. 1A), then an output can be a voltage difference between the third node N3 and the fourth node N4 (shown in FIG. 1A), and the secondary center tap CT2 is connected to a DC (direct current) node that determines a DC value of the output. Application circuit 200 can be easily understood by those of ordinary skill in the art and thus will not be further explained.

Figure 3:
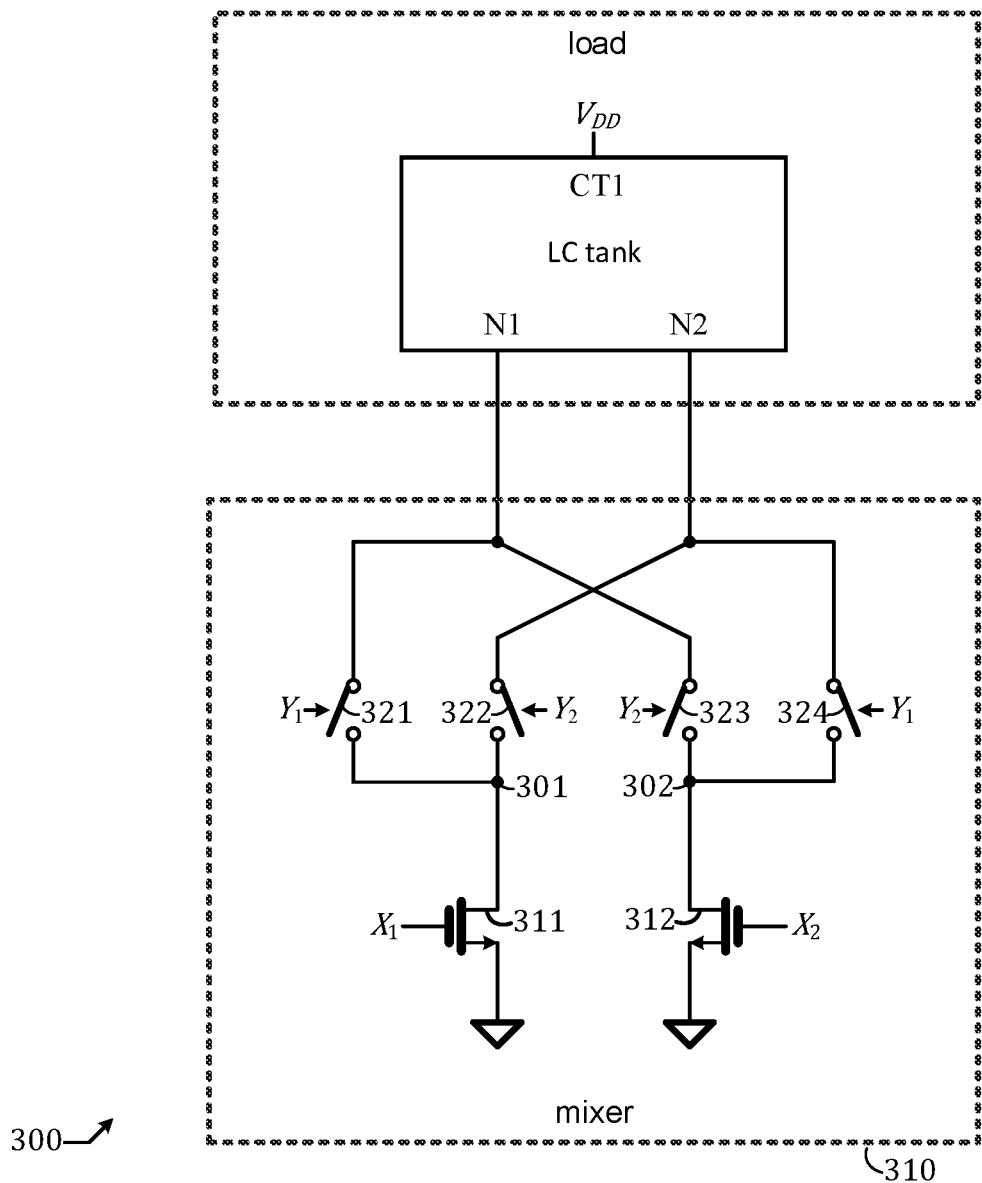
FIG. 3 shows a schematic diagram of another application circuit of the LC tank of FIG. 1A.

As shown in FIG. 3, another application circuit 300 in accordance with an embodiment of the present disclosure comprises a mixer 310 configured to mix a first differential signal comprising two voltage signals $X_1$ and $X_2$ and a second differential signal comprising another two voltage signals $Y_1$ and $Y_2$ and establish an output using LC tank 100 as a load. The mixer 310 comprises two NMOS transistors 311 and 312 and four switches 321, 322, 323, and 324. A source, a gate, and a drain of NMOS transistor 311 connect to ground, the voltage signal $X_1$, and a first internal node 301, respectively. A source, a gate, and a drain of NMOS transistor 312 connect to ground, the voltage signal $X_2$, and a second internal node 302, respectively. The first node N1 of LC tank 100 connects to the first internal node 301 via switch 321 controlled by the voltage signal $Y_1$ and connects to the second internal node 302 via switch 323 controlled by the voltage signal $Y_2$, wherein $Y_1$ and $Y_2$ are complementary logical signals. The second node N2 of LC tank 100 connects to the first internal node 301 via switch 322 controlled by the voltage signal $Y_2$ and connects to the second internal node 302 via switch 324 controlled by the voltage signal $Y_1$. The primary center tap CT1 of LC tank 100 connects to a power supply node $V_{DD}$. An output of the application circuit 300 is a voltage difference between N1 and N2. If LC tank 100 further comprises the secondary 8-shape inductor $L_3$ (shown in FIG. 1A), then an output can be a voltage difference between the third node N3 and the fourth node N4 (see FIG. 1A), and the secondary center tap is connected to a DC (direct current) node that determines the DC value of the output. The mixer 310 is known as a "Gilbert cell" in the prior art, and application circuit 300 can be easily understood by those of ordinary skill in the art and thus will not be further explained. In an embodiment, a fundamental frequency of the second differential signal (comprising $Y_1$ and $Y_2$) is approximately equal to a resonant frequency of the LC tank 100. The mixer 310 belongs to a category of mixers known as "double side-band mixer." Those skilled in the art can replace the mixer 310 with a "single side-band mixer," which still falls into a scope of the present disclosure.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An LC (inductor-capacitor) tank comprising a primary 8-shape inductor and a serial LC network that are connected in parallel across a first node and a second node and laid out using a multi-layer structure fabricated on a substrate, wherein:

the primary 8-shape inductor comprises a serial connection of a first quadrant inductor, a second quadrant inductor, a third quadrant inductor, and a fourth quadrant inductor;

the serial LC network comprises a serial connection of a first half inductor, a serial capacitor, and a second half inductor;

the third quadrant inductor is substantially a mirror image of the first quadrant inductor with respect to a plane of symmetry;

the second quadrant inductor is substantially a mirror image of the fourth quadrant inductor with respect to the plane of symmetry;

the first half inductor is substantially symmetrical with respect to the plane of symmetry; and the second half inductor is substantially symmetrically with respect to the plane of symmetry, wherein the multi-layer structure includes a first metal layer, a second metal layer, and an inter-connection via layer configured to provide connection between the first metal layer and the second metal layer.

2. The LC tank of claim 1, wherein: the first quadrant inductor is laid out from the first node to a geometrical central point on the first metal layer; the second quadrant inductor is laid out from the geometrical central point to a primary center tap on the first metal layer; the third quadrant inductor is laid out from the primary center tap to the geometrical central point mostly on the first metal layer with a small section on the second metal layer that constitutes a first half of a cross-over bridge centered at the geometrical central point; and the fourth quadrant inductor is laid out between the geometrical central point and the second node mostly on the first metal layer with a small section on the second metal layer that constitutes a second half of the cross-over bridge centered at the geometrical central point.

3. The LC tank of claim 2, wherein a first half of the first half inductor is adjacent to and parallel with a major part of the first quadrant inductor, a second half of the first half inductor is adjacent to and parallel with a major part of the third quadrant inductor, a first half of the second half inductor is adjacent to and parallel with a major part of the second quadrant inductor, and a second half of the second half inductor is adjacent to and parallel with a major part of the fourth quadrant inductor.

4. The LC tank of claim 3, wherein a value of the serial capacitor is chosen such that the serial LC network has a resonance at three times of a fundamental frequency.

5. The LC tank of claim 4, wherein the LC tank of claim 4, has a resonance at the fundamental frequency.

6. The LC tank of claim 5, wherein the first half inductor and the second half inductor are laid out on the first metal layer.

7. The LC tank of claim 5, wherein the first half inductor and the second half inductor are laid out on the second metal layer.

8. The LC tank of claim 5, being configured as a load of a differential amplifier configured to receive a voltage signal of the fundamental frequency.

9. The LC tank of claim 5 being configured as a load of a mixer configured to mix a first differential signal and a second differential signal, wherein the second differential signal is of the fundamental frequency.

10. An LC (inductor-capacitor) tank comprising: a primary 8-shape inductor and a serial LC network that are connected in parallel across a first node and a second node and laid out using a multi-layer structure fabricated on a substrate, wherein a magnetic coupling between the primary 8-shape inductor and the serial LC network is mitigated due to a layout symmetry, and a resonant frequency of the serial LC network is equal to three times of a resonance frequency of the LC tank.

11. The LC tank of claim 10, wherein the primary 8-shape inductor comprises a serial connection of a first quadrant inductor, a second quadrant inductor, a third quadrant inductor that is substantially a mirror image of the first quadrant inductor with respect to a plane of symmetry, and a fourth quadrant inductor that is substantially a mirror image of the second quadrant inductor with respect to the plane of symmetry.

12. The LC tank of claim 11, wherein the serial LC network comprises a serial connection of a first half inductor that is substantially symmetrical with respect to the plane of symmetry, a serial capacitor, and a second half inductor that is substantially symmetrical with respect to the plane of symmetry.

13. The LC tank of claim 12, wherein a first half of the first half inductor is adjacent to and parallel with the first quadrant inductor, a second half of the first half inductor is adjacent to and parallel with the third quadrant inductor, a first half of the second half inductor is adjacent to and parallel with the second quadrant inductor, and a second half of the second half inductor is adjacent to and parallel with the fourth quadrant inductor.

14. The LC tank of claim 13 being configured as a load of a differential amplifier configured to receive a voltage signal of a fundamental frequency.

15. The LC tank of claim 13 being configured as a load of a mixer configured to mix a first differential signal and a second differential signal, wherein the second differential signal is of a fundamental frequency.

* * * * *